United States Patent [19]

Delagrange et al.

[11] 4,337,527
[45] Jun. 29, 1982

[54] ACOUSTIC DOPPLER DETECTOR

[75] Inventors: Arthur D. Delagrange, Sykesville; Cabell N. Pryor, Jr.; Wayne D. Wilson, both of Silver Spring, all of Md.

[73] Assignee: The United States of America as represented by the Secretary of the Navy, Washington, D.C.

[21] Appl. No.: 184,903

[22] Filed: Sep. 29, 1971

[51] Int. Cl.³ .............................................. G01S 15/50
[52] U.S. Cl. ........................................ 367/98; 367/94
[58] Field of Search .......................... 340/3 D, 258 A; 343/5 PD, 7.7; 367/94, 98, 104

[56] References Cited

U.S. PATENT DOCUMENTS 2,961,190  11/1960  Miller et al. .................. 340/3 D X
3,394,342  7/1968   Walker ............................ 340/3 D X
3,646,506  2/1972   Suter .............................. 340/3 D X Primary Examiner—Richard A. Farley
Attorney, Agent, or Firm—R. S. Sciascia; A. L. Branning

[57] ABSTRACT

An oscillator generates a fixed frequency ultrasonic output signal. After power amplification this signal drives a transmitting transducer which projects an ultrasonic beam into water. Reflected signals are received by a receiving transducer and AGC preamplified. A chopper multiplies the received signal with the transmitted signal and generates an output signal if a target exists. To determine whether the target is a swimmer, this output signal is band pass filtered and amplified and then fed both to an automatic alarm and to a set of headphones. A human operator listening to the headphone output classifies the target and determines exact bearing.

8 Claims, 6 Drawing Figures

ACOUSTIC DOPPLER DETECTOR

BACKGROUND OF THE INVENTION

This invention relates generally to underwater acoustic detection systems and more specifically to underwater doppler detection systems.

Numerous doppler sonars have been constructed in the past to detect swimmers, torpedos, or ships. Some of these systems use pulse while others employ CW in the transmitting beam. All of these systems, however, have attempted to identify targets by filtering out those frequencies which are characteristic of the target. Consequently, the main emphasis in these prior art systems has been to develop filters to accomplish this task. As a result, some doppler sonars have thousands of pounds of electronic equipment which are composed mainly of banks of filters and switches.

Other doppler sonar systems use frequency analyzers that weigh hundreds of pounds and require 110 volt power sources. The chief disadvantages of these systems are their excessive cost, complexity, and the need for sophisticated interpretation by a trained human operator. Furthermore, the filters required to isolate target doppler signals from the background are ineffective, complex, and costly. Low velocity targets provide doppler signals so close to the fundamental frequency that they cannot be differentiated from the fundamental frequency, certainly not in a portable instrument.

The frequency analyzers which have been used to replace complex filtering systems are also heavy, expensive, and difficult to handle under adverse sea conditions. Even with modern frequency analyzers the changing environmental conditions require the constant attention of a trained technician to monitor the apparatus. Finally, an automatic alarm cannot be associated with these prior art doppler sonar systems because of the low signal-to-noise ratio.

SUMMARY OF THE INVENTION

Accordingly, one object of the present invention is to provide a new and improved doppler detector.

Another object of the instant invention is to provide a light-weight portable doppler detector for detecting swimmers.

Still another object of the present invention is the provision of an inexpensive and simple doppler detector for detecting swimmers.

A further object of the present invention is to provide a doppler detection system that does not require sophisticated interpretation by a human operator.

A still further object of the present invention is the provision of a doppler detection system capable of distinguishing low velocity swimmer targets.

Another still further object of the instant invention is the provision of a new and improved automatic gain controlled amplifier circuit.

Briefly, these and other objects of the present invention are attained by providing an acoustic doppler detector wherein an ultrasonic signal is transmitted and reflections are received, chopped and band pass filtered. The resulting signals are amplified and fed to headphones and an alarm circuit which produce output signals in response to swimmer targets.

BRIEF DESCRIPTION OF THE DRAWINGS

A more complete understanding of the invention and many of the attendant advantages thereof will be readily appreciated as the same becomes better understood by reference to the following detailed description when considered in connection with the accompanying drawings wherein.

DESCRIPTION OF THE PREFERRED EMBODIMENT

Figure 1:
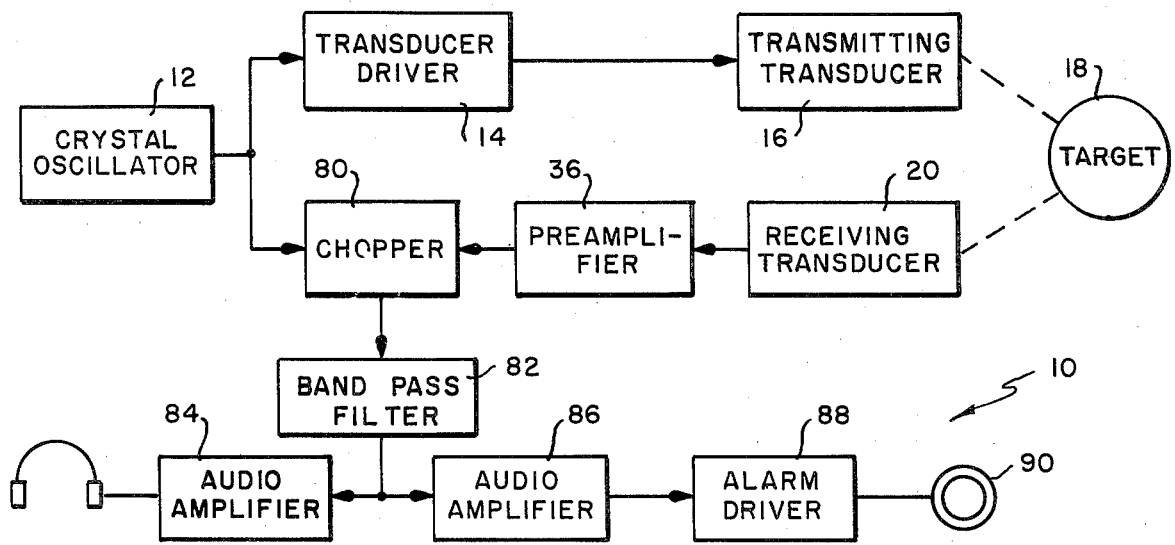
FIG. 1 is a schematic block diagrammatic view of the present invention.

Referring now to the drawings, wherein like reference characters designate corresponding parts throughout the several views, and more particularly to FIG. 1 thereof, a portable acoustic doppler detector 10 is shown including a conventional square wave crystal oscillator 12 which generates a highly frequency stabilized square wave output of, for example, 200 KHz at 20 volts peak-to-peak. This signal is fed to a conventional transducer driver 14 having an inductance at its output which power amplifies the square wave sufficiently to drive an acoustic transducer. The output of transducer driver 14 is fed to a conventional acoustic transducer 16, referred to as a transmitting transducer in FIG. 1, that is positioned in the water as is more clearly shown with reference to FIG. 2. Transmitting transducer 16 appears to transducer driver 14 to be a capacitive load coupled to ground. This load, coupled in series with the output inductance of transducer driver 14, forms a series L-C resonant circuit which, by appropriately selecting the value of the output inductance in transducer driver 14, has its resonant peak at the crystal oscillator drive frequency. Consequently, a sine wave at the drive frequency appears across transmitting transducer 16. Transmitter transducer 16 projects a beam of acoustic energy into the water. Any reflections from a target 18, such as an underwater swimmer, are received by a second conventional ultrasonic transducer 20, referred to as a receiving transducer in FIG. 1.

Figure 2:
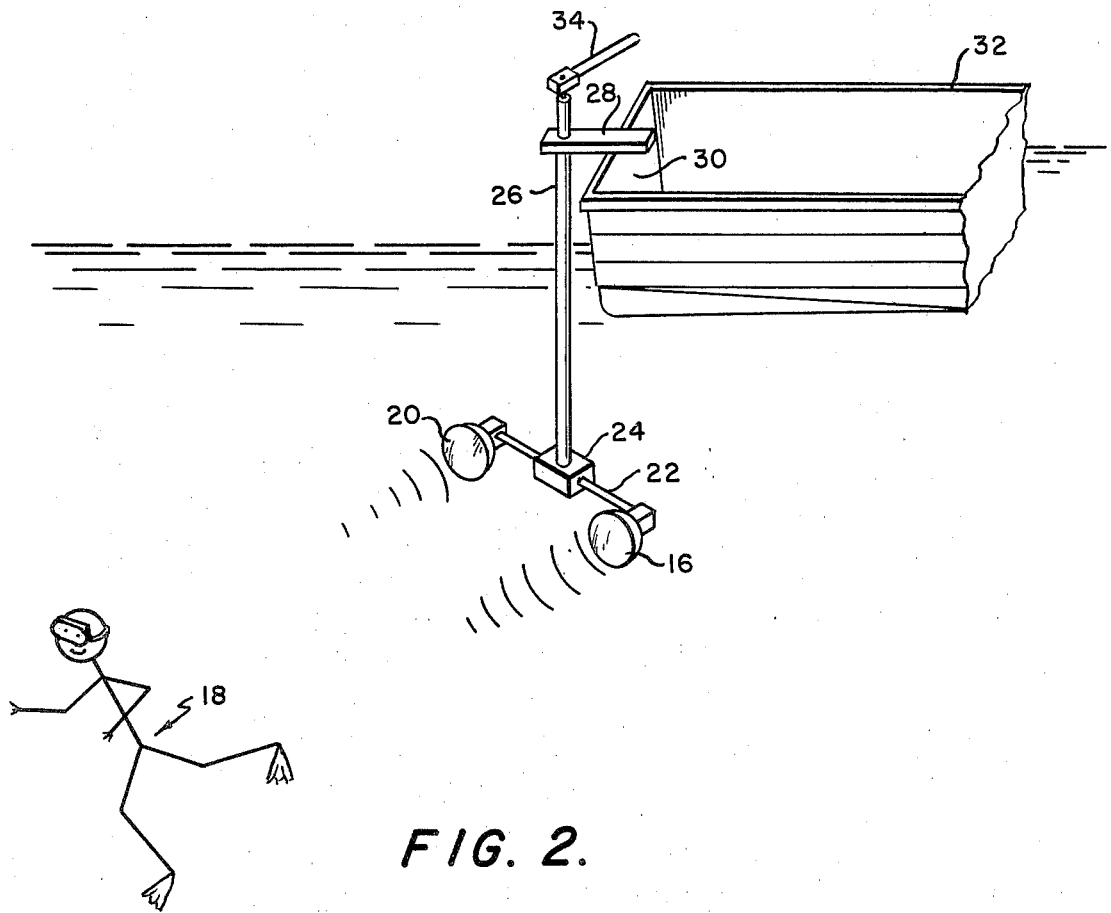
FIG. 2 is a schematic view of the transmitting and receiving transducer assembly.

The transmitting and receiving transducer assembly is shown more clearly in FIG. 2. Transmitting transducer 16 and receiving transducer 20 are circular shaped to give a narrow beam in the vertical and horizontal planes and are mounted parallel on a horizontal support bar 22 to minimize coupling. Support bar 22 is mounted in a conventional swivel device 24 that permits the transducers to be mechanically rotated in the pitch or vertical plane. A vertical support bar 26 is mechanically fastened at its lower end to swivel 24, such as by welding or clamping, and is mounted at its upper end to a conventional clamping device 28 which clamps the assembly to the gunnel 30 of a boat 32. Clamp 28 allows vertical support bar 26 to rotate and, consequently, transducers 16 and 20 to rotate in the yaw or horizontal plane. An elongated handle or control bar 34 is fastened to the upper end of vertical support bar 26 to position transducers 16 and 20 in azimuth.

The acoustic signals received by receiving transducer 20 consist of doppler signals from a target and background noise such as pick up between transducers and the doppler returns from natural environment conditions such as water current, turbulence, surface wave action, and fixed objects such as a river bottom, pilings etc. Although the background noise doppler returns vary in time with changing current and wind conditions, they appear to be of constant amplitude over a period of several seconds. In contrast to these relatively constant environmental signals, a swimmer produces a repeated signal that varies rapidly in amplitude as he kicks his feet or moves his arms to propel himself through the water.

All of the received acoustic signals are converted into electrical signals by receiving transducer 20 and fed to an automatic gain control (AGC), non-saturating preamplifier 36, described more fully hereinafter with reference to FIG. 3, which does not affect those signals that change rapidly relative to the time constant of AGC preamplifier 36, such as signals produced by an underwater swimmer. Signals that are constant in amplitude or signals that vary slowly relative to the AGC time constant are normalized by AGC preamplifier 36.

Figure 3:
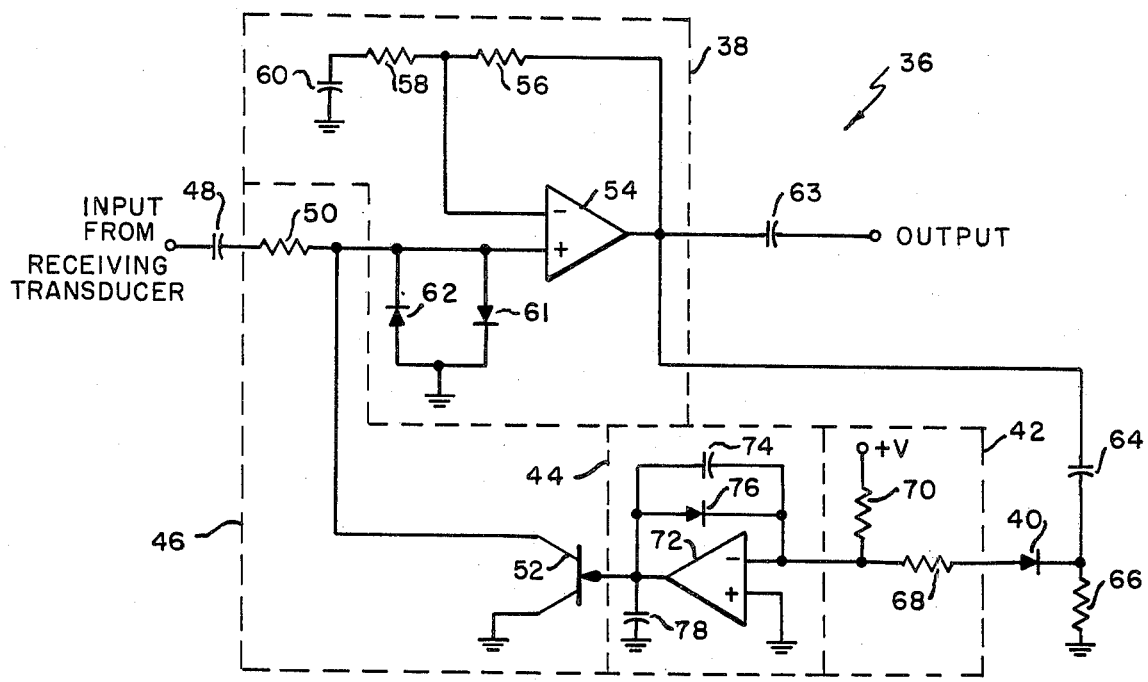
FIG. 3 is a schematic view of the AGC preamplifier circuit of the present invention.

Referring now to FIG. 3, AGC preamplifier 36 is shown as consisting of a fixed gain operational amplifier circuit 38, a rectifier 40, a threshold circuit 42 an integrator circuit 44, and a variable attenuation circuit 46. Briefly, the circuit operates as follows: The input signal from receiving transducer 20 is fed to variable attenuator 46 and the attenuator output signal is amplified by fixed gain amplifier 38. The amplifier output is sensed by rectifier 40 and the rectified signal is threshold-detected by threshold detector 42 and fed to integrator 44. The output of integrator 44 controls variable attenuator 46. If the output signal from AGC preamplifier 36 is too large, a voltage is developed greater than the threshold. Consequently, the output of integrator 44 changes in such a manner as to increase the attenuation of variable attenuator 46, which, in turn, reduces the input signal to fixed gain amplifier 38. This process continues until the output of AGC preamplifier 36 is reduced to the proper amplitude. Similarly, if the output becomes too small, the reverse process occurs and the gain is increased, bringing the output up to the proper amplitude. Integrator 44 has a time constant such that, as mentioned hereinbefore, only signals that are constant in amplitude or signals that vary slowly relative to this time constant produce an output from integrator 44 and are normalized, while the rapidly fluctuating signals produced by a swimmer do not affect integrator 44 and are thus passed to the output of AGC preamplifier 36 without being normalized.

In the circuit of FIG. 3 the input signal from receiving transducer 20 is first passed through a capacitor 48 to remove any d.c. signals and then applied to variable attenuator 46 which consists of a resistor 50 and the source to drain circuit of an n-channel field effect transistor (FET) 52, the latter of which acts as a variable resistor. Resistor 50 is connected between capacitor 48 and the non-inverting input of a conventional operational amplifier 54, while FET 52 is connected between the non-inverting operational amplifier input and ground. Thus, resistor 50 and FET 52 form a voltage divider attenuator.

The gain of fixed gain amplifier 38 is determined in the conventional manner by the ratio of a feedback resistor 56, connected between the output and inverting input of operational amplifier 54, to an input resistor 58. For example, resistor 56 may be 1 megohm and resistor 58 may be 100 ohms for a gain of 10,000. A capacitor 60 couples resistor 58 to ground for a.c. signals only to minimize any d.c. offset at the output of amplifier 54 due to offset between its two inputs. A pair of oppositely connected diodes 61 and 62 are connected between the non-inverting input to operational amplifier 54 and ground to limit the input signal. The output of fixed gain amplifier 38 is coupled to the output of preamplifier 36 through a capacitor 63 to remove any d.c. offset.

The output of fixed gain amplifier 38 is a.c. coupled by a capacitor 64 and a resistor 66 to diode 40 to remove any d.c. in the feedback loop and then rectified by diode 40. Threshold circuit 42 consists of a resistor 68 connected between the anode of diode 40 and the input of integrator 44, and a resistor 70 connected between a source of positive potential $+V$ and the input to integrator 44. Integrator 44 consists of a conventional operational amplifier 72 having its inverting input connected to resistors 68 and 70 and its non-inverting input connected to ground. An integrating capacitor 74 and a diode 76 are connected between the inverting input and output of operational amplifier 72.

Positive potential $+V$ produces a positive bias at the inverting input of operational amplifier 72 that results in a negative output voltage from operational amplifier 72. This negative voltage applied to the gate of FET 52 is sufficient to keep FET 52 "pinched-off" and consequently its source to drain resistance is high. Consequently, there is little attenuation of the input signal by attenuator 46. If the input signal to AGC preamplifier 36 becomes very strong, the output voltage from fixed gain amplifier 38 increases sufficiently to make the average current through resistor 68 and diode 40 greater than the current through resistor 70. Consequently, the output voltage of integrator 44 goes positive. When this voltage reaches the "pinch-off" voltage of FET 52, its source to drain resistance lowers, thereby increasing the attenuation of the input signal and maintaining the output signal from fixed gain amplifier 38 at the desired normalized level. A capacitor 78 connected between the output of integrator 44 and ground prevents input signal leak-through from affecting operational amplifier 72. Diode 76 prevents operational amplifier 72 from over-driving FET 52.

AGC preamplifier 36 has several advantages over previous designs. Due to the negative feedback loop, FET 52 has a constant a.c. voltage across it independent of the input voltage so that distortion does not occur, even at input amplitudes of several volts. FET 52 requires no d.c. bias in the signal path so that attenuation changes do not produce a d.c. shift across it and, consequently, no transients are observed at the output of AGC preamplifier 36. By having FET 52 at the non-inverting input of operational amplifier 54 the loop gain of operational amplifier 54 is independent of attenuation, so that compensation for operational amplifier 54 is optimum under all conditions. Furthermore, the use of an operational amplifier with negative feedback gives an inherently low output impedance so the output amplitude is not affected by loading. Finally, the maximum gain is set by operational amplifier 54 and is not affected by the characteristic of FET 52.

The output of AGC preamplifier 36 is fed to a conventional chopper circuit 80 where it is chopped at the frequency of crystal oscillator 12. Thus, the AGC preamplifier output signal is effectively multiplied by the square wave oscillator signal. The resulting product is equivalent to "sum" and "difference" frequencies. Alternatively, this product can be obtained by a conventional balanced modulator or an analog multiplier.

A band pass filter 82 having steep slopes immediately outside the pass band of, for example 24 db/octave, and a pass band of, for example 300 to 600 Hz receives the output signal from chopper 80. This filter may consist of, for example, a pair of conventional stagger-tuned narrow band filters coupled in series. Alternatively, in place of the usual L-C sections, active filters may be used consisting of an operational amplifier with a bridged-tee network in the feedback loop. Filter 82 removes the portion of the "difference" signal produced by the environment, all of the "sum" signal, and unwanted signals produced by the system, such as d.c. and harmonics of crystal oscillator 12. Thus, if the received signal is identical to the transmitted signal the "difference" frequency is zero or d.c. and is immediately filtered out. However, if the received signal has been modulated in frequency by movement of the target the spectrum is spread out over some finite frequency band and may therefore be retained if it falls within the pass band of filter 82. The signal spectra for the transmitted signal, received signal, chopper output, filter band pass, and filter output are illustrated in FIGS. 4(a)-4(e), respectively.

The spectra from the environment and a swimmer target overlap. The environmental spectrum, however, falls off very sharply with increasing frequency while the spectrum from a swimmer target falls off with increasing frequency but not nearly as fast. Consequently, the steep slope of band pass filter 82 more greatly attenuates the background spectrum than the target spectrum, thereby increasing the signal-to-noise ratio.

The output from band pass filter 82 is fed simultaneously to two conventional audio amplifiers 84 and 86. The output of audio amplifier 84 which has, for example, a fixed gain of 10, is fed to a conventional set of headphones which are worn by an operator of portable acoustic doppler detector 10. A valid swimmer target produces in these headphones a sound within the band of frequencies determined by band pass filter 82 enabling human recognition and identification of the underwater swimmer. The output of audio amplifier 86 which has, for example, a fixed gain of 100, is fed to an alarm driver circuit 88, described more fully hereinafter with reference to FIG. 5. Alarm driver circuit 88 operates a conventional alarm 90, such as a bell, if its input signal satisfies specified amplitude and duration criteria which are as follows: If the voltage from audio amplifier 86 exceeds a selected amplitude, alarm driver circuit 88 waits a fixed period of "dead" time, for example, one second. If the output of audio amplifier 86 exceeds the selected amplitude again within a fixed "live" time period for example, five seconds after the termination of the "dead" time period an output signal is generated to set off alarm 90. Thus, a short transient signal of less than one second duration does not set off alarm 90, but two signals or one extended signal do. Consequently, false alarms are greatly reduced.

Figure 5:
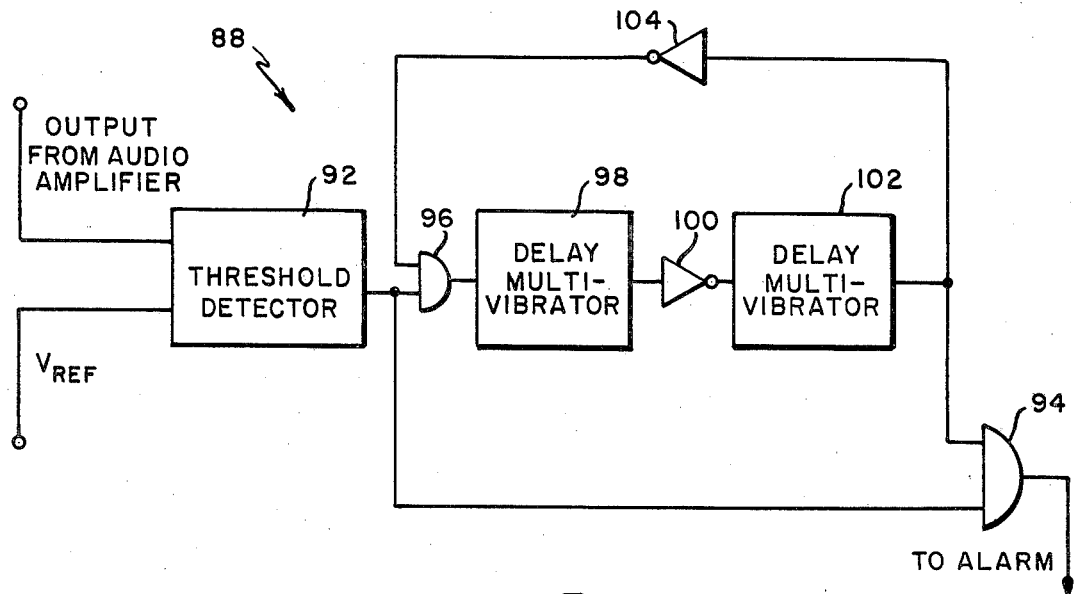
FIG. 5 is a schematic view of the alarm driver circuit of the present invention.
Figure 4:
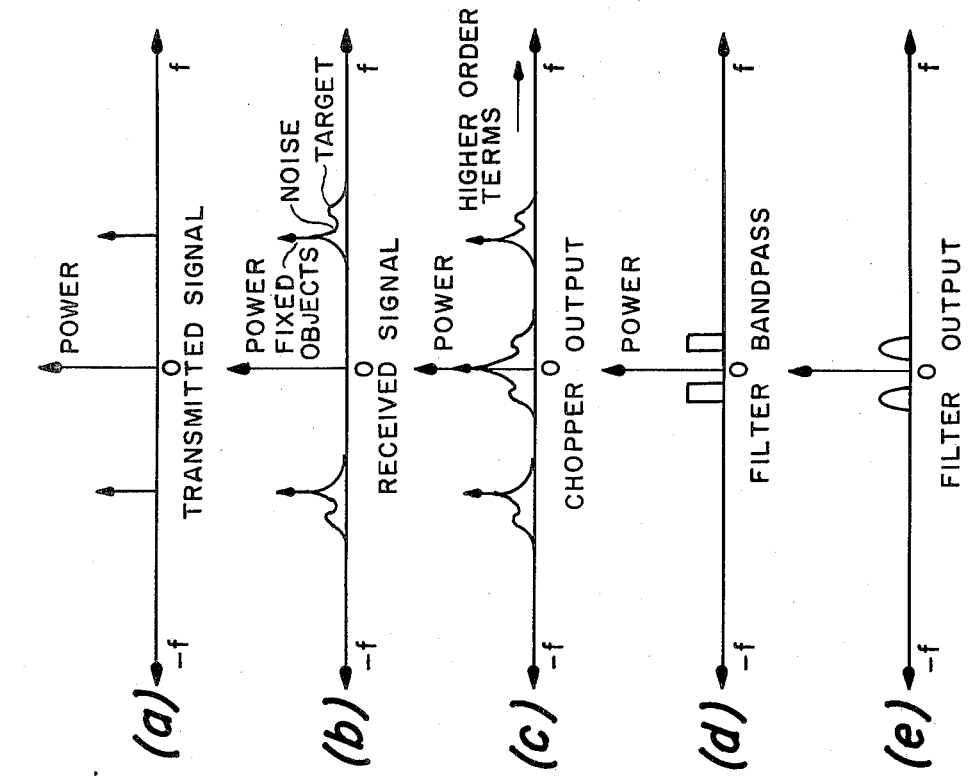
FIGS. 4(a)-(e) are graphical views of the signal spectra from various elements of the present invention.
Figure 6:
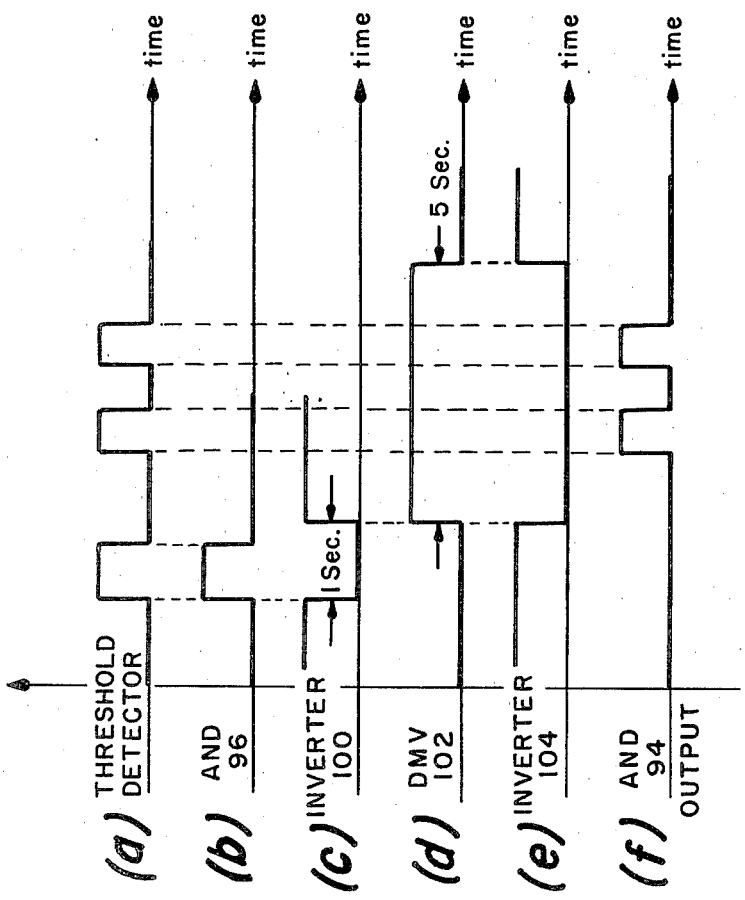
FIGS. 6(a)-(f) are plots of binary output versus time of various elements in the alarm driver circuit of FIG. 5.

Referring now to FIG. 5, the output from audio amplifier 86 is applied to a conventional threshold detector 92 where it is compared with a d.c. potential $V_{REF}$. If the audio amplifier output signal is greater in magnitude than $V_{REF}$, threshold detector 92 produces a binary output signal. This signal is applied simultaneously to an output AND gate 94 and a trigger AND gate 96. AND gate 96 has a second input that is initially high or binary "1," as described hereinafter, so that an initial binary "1" output signal from threshold detector 92 produces a "1" output from AND gate 96, as illustrated more clearly in FIGS. 6(a) and (b). The transition in the output of AND gate 96 from "0" to "1" triggers a conventional delay multivibrator 98 which has a delay time of, for example, one second. This delay signal is inverted in a conventional inverter 100 to produce the output waveform shown in FIG. 6(c). The output of inverter 100 is coupled to a conventional delay multivibrator 102 which has a delay time of, for example, five seconds. The output of delay multivibrator 102 is coupled to the input of AND gate 94. Initially, the output of delay multivibrator 102 is low or binary "0". Consequently, an initial output signal from threshold detector 92 produces no output signal from alarm driver 88; this is the alarm driver "dead" time. At the end of the one second delay period produced by delay multivibrator 98, inverter 100 has a transition from "0" to "1", as shown in FIG. 6(c), that triggers delay multivibrator 120 which generates a binary "1" output signal for five seconds, as shown in FIG. 6(d). During this five second interval AND gate 94 is enabled and, consequently, any output signal from threshold detector 94 will generate an alarm output signal, as shown in FIG. 6(f). This period is thus the "live" time of alarm driver circuit 88. The output of delay multivibrator 102 is inverted by a conventional inverter 104 whose output, shown in FIG. 6(e), is fed to the input of AND gate 96 to inhibit the operation of delay multivibrator 98 during the five second "live" period. At the end of the five second "live" period AND gate 94 is again disabled and AND gate 96 is again enabled. Thus, the cycle is completed.

In operation, an audible or visual signal generated by alarm 90 alerts the operator that a suspicious target is present. The operator then puts on the headphones and makes a definite target classification and determines the exact bearing by noting the direction of transmission and reception of the ultrasonic signal.

Obviously, numerous modifications and variations of the present invention are possible in the light of the above teachings. For example, the alarm driver circuit could be modified to require several threshold circuit outputs before the alarm would be set off. In addition, it should be understood that the transmitting and receiving transducers need not be mounted in the same housing, but can be separated by several feet, if desired. It is therefore to be understood that within the scope of the appended claims, the invention may be practiced otherwise than as specifically described herein.

What is claimed as new and desired to be secured by Letters Patent of the United States is:

1. An acoustic doppler detection system for detecting underwater targets comprising:
 transmitting means coupled to a source of ultrasonic electrical energy for converting said ultrasonic energy into acoustic energy and for transmitting said acoustic energy;
 receiving means for receiving reflections of said acoustic energy and for converting said reflections into received electrical signals;
 preamplifying means for amplifying portions of said received electrical signals to a predetermined level to produce an automatic gain controlled output signal;
 multiplying means for electrically multiplying said ultrasonic electrical energy by said automatic gain controlled output signal;

filtering means for band pass filtering the output of said multiplying means to produce a difference signal; and output means coupled to said band pass filtering means for generating a plurality of output signals in response to acoustic reflections from said underwater targets.

2. The acoustic doppler detection system of claim 1, wherein said transmitting means comprises:

a transducer driver amplifier coupled to the output of said source of ultrasonic electrical energy; and an ultrasonic acoustic transducer coupled to the output of said transducer driver amplifier.

3. The acoustic doppler detection circuit of claim 1, wherein said receiving means comprises an ultrasonic acoustic transducer.

4. The acoustic doppler detection circuit of claim 1, wherein said preamplifying means comprises:

variable attenuator means coupled to the output of said receiving means for variably attenuating said received electrical signals;

a fixed gain amplifier coupled to the output of said variable attenuator means;

rectifying means for rectifying the output of said fixed gain amplifier;

threshold detecting means for generating an output signal when the output of said rectifying means is greater than a predetermined amplitude; and integrating means coupled to the output of said threshold detecting means for integrating the output of said threshold detecting means with respect to time and for controlling the attenuation of said variable attenuator means.

5. The acoustic doppler detection circuit of claim 1, wherein said multiplying means comprises an electronic chopper.

6. The acoustic doppler detection circuit of claim 1, wherein said multiplying means comprises a balanced modulator.

7. The acoustic doppler detection circuit of claim 1, wherein said filtering means comprises a pair of stagger-tuned narrow band filters connected in series.

8. The acoustic doppler detection circuit of claim 1, wherein said output means comprises:

a first audio amplifier coupled to the output of said filtering means for amplifying said difference signal and connectable to a set of headphones for generating one of said plurality of output signals;

a second audio amplifier coupled to the output of said filtering means for amplifying said difference signal;

means operable in response to the output of said second audio amplifier for selectively generating another of said plurality of output signals.

* * * * *